(12) United States Patent
Mühlbacher et al.

(10) Patent No.: US 7,750,687 B2
(45) Date of Patent: Jul. 6, 2010

(54) CIRCUIT ARRANGEMENT COMPRISING A LEVEL SHIFTER AND METHOD

(75) Inventors: Benno Mühlbacher, Bad St. Leonhard (AT); Andreas Wiesbauer, Pörtschach (AT); Martin Clara, Villach (AT); Dieter Draxelmayr, Villach (AT)

(73) Assignee: Infineon Technologies AG, Munich (DE)

(*) Notice: Subject to any disclaimer, the term of this patent is extended or adjusted under 35 U.S.C. 154(b) by 492 days.

(21) Appl. No.: 11/546,009

(22) Filed: Oct. 11, 2006

(65) Prior Publication Data

US 2008/0100342 A1    May 1, 2008

(51) Int. Cl.
  *H03K 3/00* (2006.01)
(52) U.S. Cl. ...................................... 327/108
(58) Field of Classification Search ............. None
  See application file for complete search history.

(56) References Cited

U.S. PATENT DOCUMENTS

| 4,146,846 | A | * | 3/1979 | Thomas et al. | 330/293 |
| 5,486,787 | A | * | 1/1996 | Maekawa et al. | 327/560 |
| 5,534,810 | A | * | 7/1996 | White | 327/308 |

* cited by examiner

*Primary Examiner*—Lincoln Donovan
*Assistant Examiner*—Khareem E Almo
(74) *Attorney, Agent, or Firm*—Maginot, Moore & Beck

(57) ABSTRACT

A circuit arrangement includes a first level shifter, an output stage, and a feedback circuit. The first level shifter is coupled to receive an input signal having a first voltage level from an input terminal, and is configured to provide a level-shifted signal having a second voltage level higher than the first voltage level. The output stage includes a first transistor that has a control terminal operably coupled to an output of the first level shifter. The output stage is configured to provide at an output terminal of the output stage an output signal based on the level-shifted signal. The feedback circuit is configured to feed back the output signal to the output of the first level shifter.

42 Claims, 8 Drawing Sheets

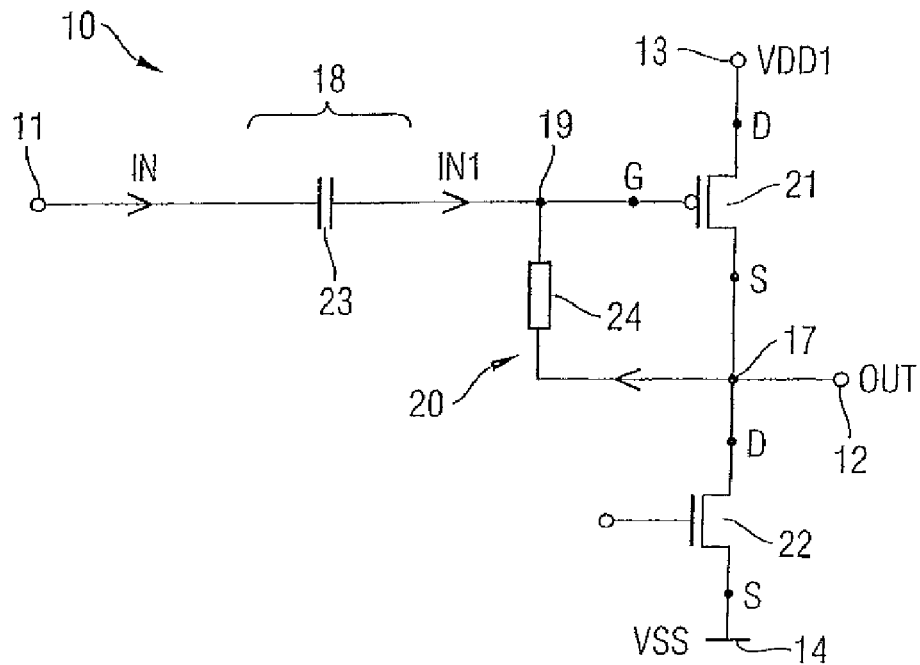
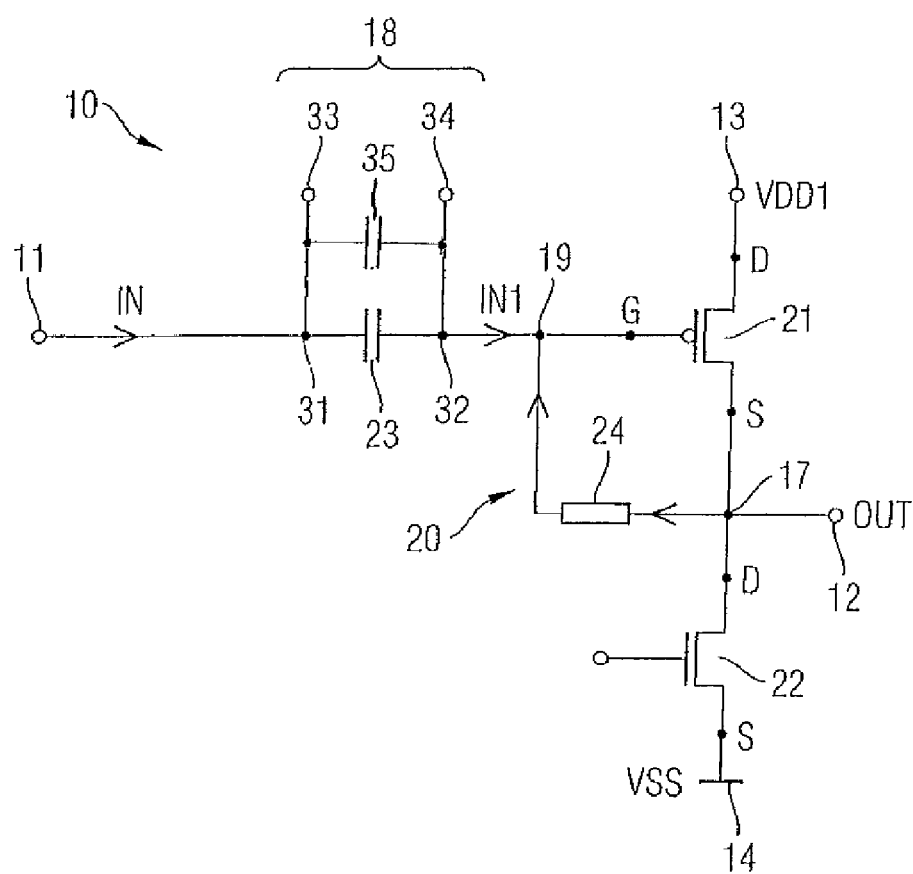

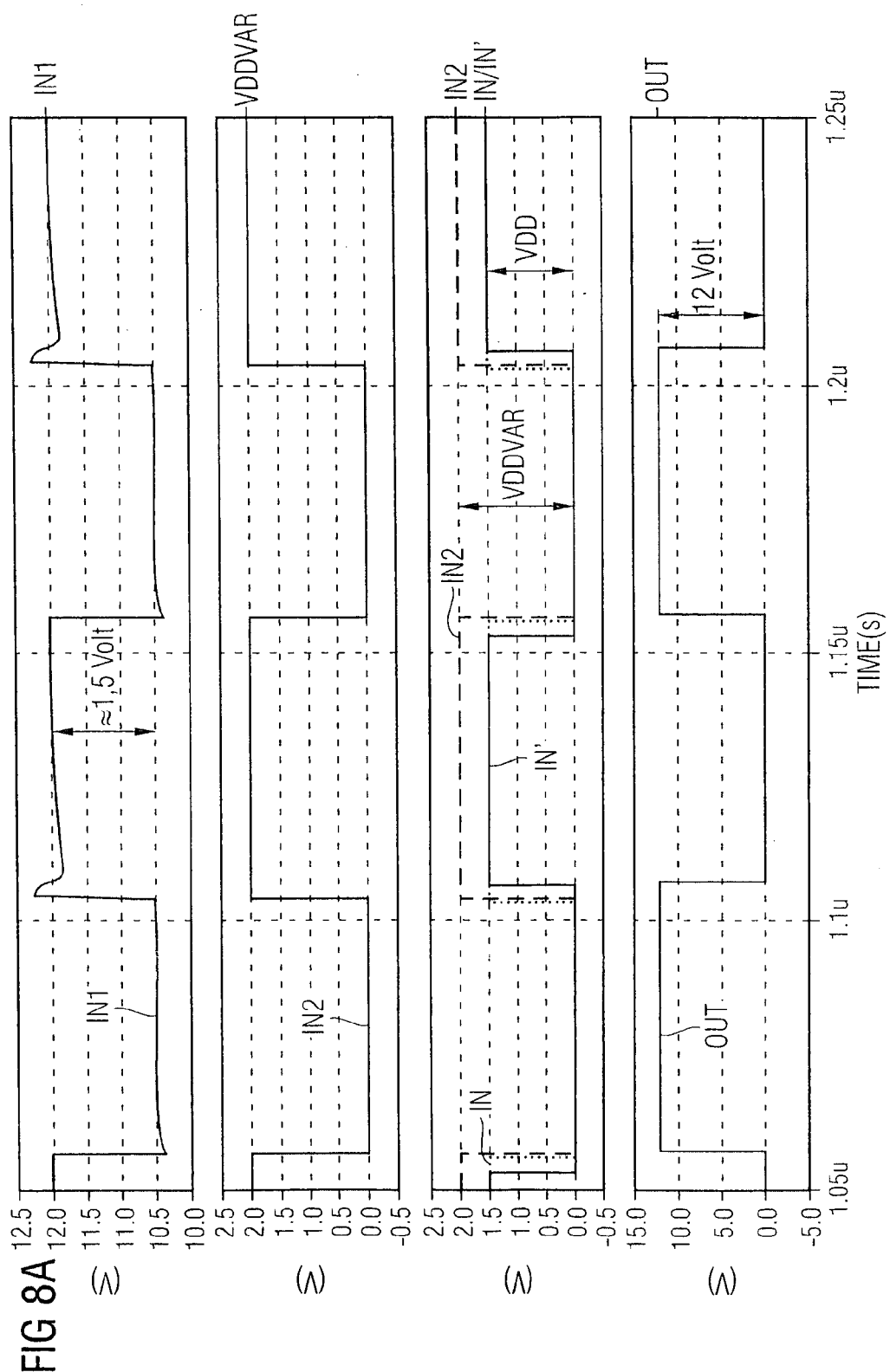

CIRCUIT ARRANGEMENT COMPRISING A LEVEL SHIFTER AND METHOD

TECHNICAL FIELD

The present invention relates to circuit arrangements which comprise a level shifter. The present invention further relates to a method for operating a circuit arrangement.

TECHNICAL BACKGROUND

As is generally well known, digital logic circuits are widely used in the areas of electronics and computer type equipment. However, the various digital logic circuits that communicate with one another may have different supply voltages. Thus, there is typically a need for a voltage conversion arranged between the two different voltages, so that the two circuits will be compatible with each other. Level shifters may be used to transfer levels of a given input signal to typically higher levels of an output signal.

SUMMARY

A first embodiment of the invention is a circuit arrangement that includes a first level shifter, an output stage, and a feedback circuit. The first level shifter is coupled to receive an input signal having a first voltage level from an input terminal, and is configured to provide a level-shifted signal having a second voltage level higher than the first voltage level. The output stage includes a first transistor that has a control terminal operably coupled to an output of the first level shifter. The output stage is configured to provide at an output terminal of the output stage an output signal based on the level-shifted signal. The feedback circuit is configured to feed back the output signal to the output of the first level shifter.

Another embodiment of the invention is a related method. Several other embodiments are described herein.

BRIEF DESCRIPTION OF THE DRAWINGS

FIG. 2 shows a circuit arrangement according to an embodiment of the present invention;

FIG. 3 shows a circuit arrangement according to an embodiment of the present invention;

FIG. 8a, 8b show timing diagrams for illustrating the principal level-shifting operation of the circuit arrangements as shown in FIGS. 6 and 7.

In all figures of the drawings, elements and signals which are the same or have the same function have been provided with the same reference symbols—unless stated otherwise.

DETAILED DESCRIPTION OF EMBODIMENTS

Figure 1:
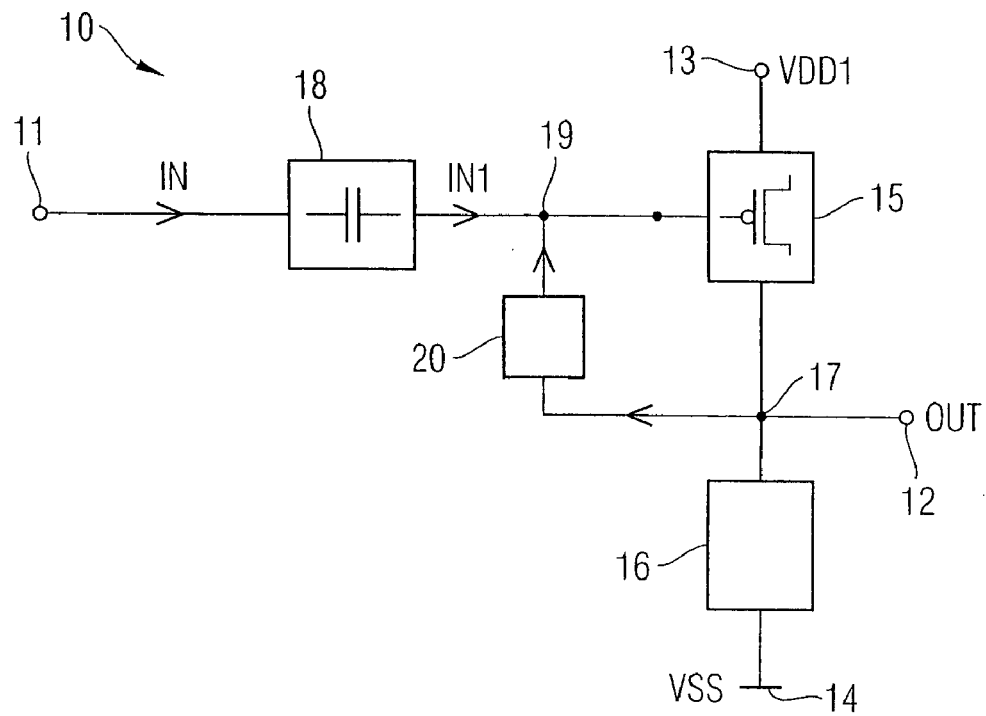
FIG. 1 shows a block-diagram illustrating a circuit arrangement according to an embodiment of the present invention.

Embodiments of the invention are explained in more detail below using exemplary embodiments which are specified in the schematic figures of the drawing.

According to an embodiment of the present invention, a circuit arrangement is provided which shifts a reference voltage based input signal to an output signal which is based on a different reference voltage. This circuit arrangement may directly drive an output transistor which may for example be part of an output circuit of a line driver.

According to an embodiment of the present invention, a circuit arrangement is provided, comprising an input terminal to receive an input signal having a first voltage level, a first level shifter coupled with the input terminal to provide at an output terminal of the first level shifter a level-shifted signal having a second voltage level higher than the first voltage level, an output stage comprising a first transistor, the first transistor comprising a control terminal coupled to the first level shifter to provide at an output terminal of the output stage an output signal based on the level-shifted signal, a feedback circuit coupling the output stage and the first level shifter to feed back the output signal to the output terminal of the level shifter.

In one embodiment of the circuit arrangement according to an embodiment of the present invention the control terminal of the first transistor is connected to a node, wherein the output of the first level shifter and the feedback circuit are further directly connected to the node.

In a further embodiment a first supply terminal is provided to provide a first supply voltage higher than the first voltage level, and wherein a conduction path of the output transistor is arranged between the first supply terminal and the output terminal.

In a further embodiment the first level shifter comprises at least one device comprising a capacitance to provide the level-shifted signal, wherein the at least one capacitor comprising a first electrode coupled to the input terminal and a second electrode coupled to the output of the first level shifter and the feedback circuit.

In a further embodiment the device comprising a capacitance comprises at least one capacitor. However, it may also be possible that the device comprises a transistor or a capacitor network.

In a further embodiment the capacitance of the at least one capacitor is higher than a gate-capacitance of the first transistor.

In a further embodiment the capacitance of the at least one capacitor is within a range of 0.5 to 1.5 of the gate-capacitance of the first transistor.

In a further embodiment the feedback circuit comprises a voltage divider.

In a further embodiment the voltage divider comprises a capacitive or a resistive bridge circuit.

In a further embodiment a driver is arranged between the input terminal and the first level shifter.

In a further embodiment the driver provides a first signal to the level shifter having a third voltage level, wherein the third voltage level is in the range between the first and the second voltage level.

In a further embodiment the third voltage level is variable dependent on a supply voltage applied to the driver.

In a further embodiment the driver comprises at least two inverters which are composed scaled to each other.

In a further embodiment a second level shifter is provided between the input terminal and the driver to provide to the driver a second level-shifted signal having the variable third voltage level.

In a further embodiment the driver provides a second signal to the first level shifter having the first voltage level.

In a further embodiment a first external capacitor terminal connected to a first electrode of the capacitor and a second external capacitor terminal connected to a second electrode of the capacitor are provided to connect at least one external capacitor parallel to the at least one capacitor.

In a further embodiment a second supply terminal having a second supply voltage is provided wherein said second supply voltage is either a ground potential or a reference potential and a third supply terminal having a third supply voltage is provided wherein the third supply voltage is equal to the first voltage level or in the range between the first voltage level and the second voltage level.

In a further embodiment the third supply voltage is at least by a factor $((C2+C1)/C1)$ higher than the first voltage level, wherein C1 is the capacitance of the capacitor and C2 is the gate-capacitance of the first transistor and a parasitic capacitance at the node.

In a further embodiment the second level shifter is supplied by the second supply voltage and the third supply voltage.

In a further embodiment the driver is supplied by the second supply voltage and the third supply voltage.

In a further embodiment the first transistor is a field controlled transistor.

In a further embodiment the first transistor is a p-channel MOSFET having a source terminal which is connected to the output terminal, having a drain terminal which is connected to the first supply terminal and having a gate terminal which is connected to the common node.

In a further embodiment the output stage comprises a second transistor having a conductivity type opposite to the conductivity type of the first transistor, wherein the conduction paths of the first transistor and the second transistor are arranged in series connection to each other and between the first supply terminal and the second supply terminal, wherein a tap between the first and the second output transistor defines an output terminal of the circuit arrangement.

In a further embodiment a first input terminal for a first input signal having the first voltage level, the level-shifter and the first transistor form a first branch and a second branch is provided comprising a second input terminal for a second input signal having the first voltage level and the second transistor.

In a further embodiment a further circuit is provided wherein the input terminal of the circuit arrangement forms the input of the further circuit and wherein an output of the further circuit is coupled to the first input terminal and the second input terminal to provide two non overlapping digital input signals of a similar shape based on the input signal to the first input terminal and the second input terminal, respectively.

In a further embodiment a dummy circuit is provided within the second branch which puts a delay to the second input signal such that the first input signal and the second input signal have a same delay when running through the respective branches.

In a further embodiment the second branch comprises a second driver between the second input terminal and the second transistor, wherein the second driver corresponds to the first driver.

According to further embodiments, a circuit arrangement is provided comprising an input terminal to receive a first signal having a first voltage level, a driver coupled to the input terminal to receive the first signal and to provide a second signal based on the first signal, a capacitor comprising a first electrode coupled to the driver to receive the second signal and a second electrode to provide a third signal having a second level higher than the first level, an output stage comprising a transistor, the transistor comprising a control terminal coupled to the second electrode of the capacitor to receive the third signal and to provide an output signal based on the received third signal.

In one embodiment of the circuit arrangement according to an embodiment of the present invention a circuit coupled to the second electrode is provided to provide at the second electrode a voltage higher than the first voltage level.

In a further embodiment the circuit is a feedback circuit to feed back the output signal to the second electrode of the capacitor.

In a further embodiment the feedback circuit comprises a voltage divider.

In a further embodiment the capacitance of the capacitor is higher than a gate-capacitance of the first transistor.

In a further embodiment a driver is provided between the input terminal and the first level shifter.

In a further embodiment the driver provides a first signal having a third voltage level to the level shifter, wherein the third voltage level is in a range between the first and the second voltage level.

In a further embodiment the third voltage level is variable dependent on a supply voltage applied to the driver.

In a further embodiment a second level shifter is provided between the input terminal and the driver to provide to the driver a second level-shifted signal having the variable third voltage level.

In a further embodiment a first external capacitor terminal connected to the first electrode of the capacitor and a second external capacitor terminal connected to the second electrode of the capacitor are provided to connect at least one external capacitor in parallel to the at least one capacitor.

In a further embodiment the output stage comprises a second transistor having a conductivity type opposite to the conductivity type of the first transistor, wherein the conduction paths of the first transistor and the second transistor are arranged in series connection to each other and between the first supply terminal and the second supply terminal, wherein a tap between the first and the second transistors defines an output terminal of the circuit arrangement.

One embodiment of the invention further provides a method for operating a circuit arrangement, comprising a providing an input signal having a first voltage level to an input terminal of the circuit arrangement, a level shifting of the input signal to provide a level-shifted signal having a second voltage level higher than the first voltage level and providing the level-shifted signal to a control terminal of a first transistor for switching the first transistor and for providing at an output terminal of the first transistor an output signal based on the level-shifted signal. According to this embodiment, the output signal is feed back the output signal to the control terminal of the first transistor.

In one embodiment of the method according to an embodiment of the present invention the fed back output signal together with the level shifted signal are directly provided to the control terminal of the first transistor.

In a further embodiment the output signal is derived from a first supply voltage higher than the first voltage level.

In a further embodiment prior to the step of level shifting the input signal this input signal is amplified to provide an amplified input signal.

In a further embodiment prior to the step of amplifying the input signal this input signal is level shifted to provide a level shifted input signal.

In a further embodiment the step of level shifting is performed by a capacitor.

In a further embodiment the capacitor is an internal (i.e. integrated) capacitor and wherein for the step of level shifting an external capacitor is connected in parallel to the internal capacitor.

In a further embodiment a second transistor is provided having a conductivity type opposite to the conductivity type of the first transistor, wherein the conduction paths of the first transistor and the second transistor are arranged in series connection to each other and between the first supply terminal and the second supply terminal, wherein two non overlapping digital input signals of a similar shape based on the input signal are generated and each one of these non-overlapping signals is assigned to a corresponding control terminal of the first and second transistors.

FIG. 1 shows by means of a block-diagram an embodiment of a circuit arrangement according to the present invention.

This circuit arrangement is denoted by reference symbol 10. According to an exemplary embodiment, the circuit arrangement 10 is a high voltage level shifting circuit which is capable to transfer a low voltage level of an input signal to a comparatively thereto higher voltage level of an output signal.

The circuit arrangement 10 comprises an input terminal 11 and an output terminal 12. At an input of the circuit arrangement 10 an input signal IN is applied to the input terminal 11. At the output of the circuit arrangement 10, an output signal OUT is provided to the output terminal 12 which may be received from other circuit elements which are arranged downstream the circuit arrangement 10.

Figure 1A:
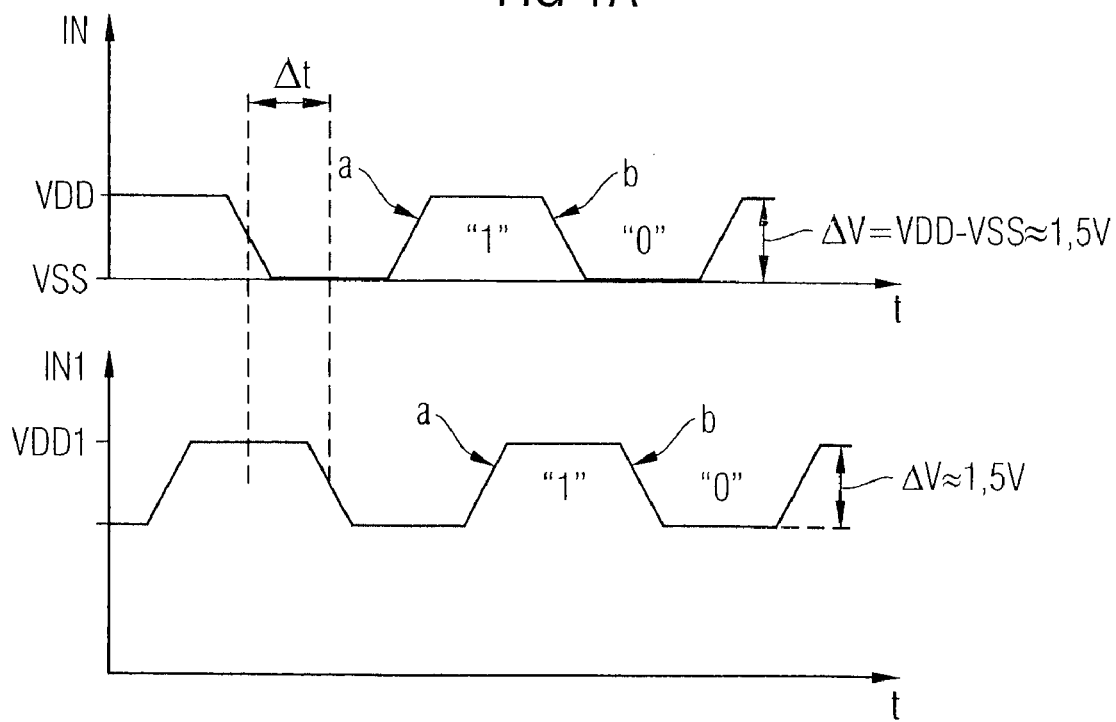
FIG. 1a shows a timing diagram for illustrating the principal level-shifting operation of the circuit arrangement as shown in FIG. 1.

The input signal IN may be according to one embodiment a digital input signal having two different levels wherein a first level represents a first low digital value ("0", low) and a second higher level represents a second high digital level ("1", high). FIG. 1a shows the timing diagram of the digital input signal IN having rising edges a for indicating a signal switch from a logic "0" to a logic "1" and falling edges b for indicating a signal switch from a logic "1" to a logic "0".

The low level of the input signal IN may be derived from a first supply potential VSS and the high level may be derived from a second supply potential VDD which is higher (VDD>VSS) than the first supply potential VSS. According to one embodiment, the first supply potential VSS corresponds to the potential of reference ground (e.g. 0 Volt) and the second supply potential VDD is a positive voltage (e.g. 1.5 Volt). Thus, the input signal IN digitally swings between the two voltage levels 0 Volt and 1.5 Volt. The signal swing, i.e. the difference between the low level and the high level, is here $\Delta V = 1.5$ Volt.

The circuit arrangement 10 further comprises a first supply terminal 13 having a third supply potential VDD1 and a second supply terminal 14 provided with the first supply potential VSS. The levels (high, low) of the output signal OUT are according to one embodiment derived from the third supply potential VDD1 and first supply potential VSS.

In operation, the circuit arrangement 10 as illustrated in FIG. 1 transfers the low and high levels of the input signal IN to corresponding low and high levels of the output signal OUT.

The circuit arrangement 10 comprises a first switching device 15 and a second switching device 16 which are arranged in series connection to each other and between the first supply terminal 13 and the second supply terminal 14. A tap 17 between the first switching device 15 and the second switching device 16 is connected to the output terminal 12 for the output signal OUT.

The circuit arrangement 10 further comprises a first level shifter 18. The first level shifter 18 is arranged between the input terminal 11 and a control terminal 19 of the first switching device 15. The first level shifter 18 is designed to provide a level shifted input signal IN1 wherein the high and low levels of the level shifted input signal IN1 are both higher than the corresponding levels of the input signal IN (see FIG. 1a).

In line with embodiments of the present invention, a feedback circuit 20 is provided which is arranged between the tap 17 and the control terminal 19 of the first switching device 15 in order to feed back the output signal OUT to the control terminal 19. The feedback circuit sets up an operation point for the level shifted input signal IN1 which is used to control the first switching device 15. FIG. 1a shows the time dependent behavior of the level shifted input signal IN1.

The first level shifter 18 in combination with the feedback circuit 20 may according to one embodiment generate the level shifted input signal having its low level at about 10.5 Volt and its high level at about 12 Volt when being supplied by VDD1≈12V. Thus, with the circuit arrangement 10 having a level shifter 18, the first switching device 15 and the feedback circuit 20 it is possible to transfer the digital input signal IN referenced to a first reference voltage VDD to a level shifted signal IN1 referenced to another reference voltage VDD1 whereas both signals show (almost) the same signal swing $\Delta V$.

In the circuit arrangement 10, the signal delay $\Delta T$ between the input signal IN and the level shifted input signal IN1 is reduced compared to known level shifter circuits since the first level shifter 18 works dynamically. According to one embodiment, the dynamic operation of the first level shifter 18 may be achieved by implementing the level shifter 18 in form of a capacitor which is shown herein after with regard to the embodiment in FIG. 2.

FIG. 2 shows a block-diagram illustrating a second embodiment of a circuit arrangement according to an embodiment of the present invention.

In the exemplary embodiment in FIG. 2, the switching devices (as shown in FIG. 1) are in the form of field controlled transistors 21, 22 such as MOS transistors (or shortly MOSFETs). According to one embodiment, the first switching device is a PMOS transistor 21, whereas the second switching device is a NMOS transistor 22. Nevertheless, it is noted that the transistors of the switching devices may also be bipolar-type transistors, JFETs, IGBTs, etc.

The MOS transistors 21, 22 are designed such that they are able to receive Drain/Source-voltages and Drain/Gate-voltages which correspond or are even higher than the third supply voltage VDD1 (e.g. min. 12 Volt). The Gate/Source-voltage is only able to receive a voltage which corresponds to the voltage level of the input signal IN (e.g. max. 1.5 Volt). The feedback circuit 20 reduces the voltage of the output signal OUT to this voltage levels.

One embodiment of the invention provides MOS transistors 21, 22 which are constructed in a stacked arrangement, e.g. the MOS transistors 21, 22 are arranged in cascode circuit configuration.

Further, the level shifter 18 is for example in form of a capacitor, however, the level shifter 18 may also be any other device comprising a capacitance. E.g. the level shifter 18 may also be a MOS transistor or the like. In addition to that, the level shifter 18 may also be realized by a plurality of capacitors, such as a capacitor network and/or a series connection of different capacitors.

The feedback circuit in FIG. 2 is in the form of a voltage divider, e.g. a resistive divider. The feedback circuit 20 comprises a resistor 24 which is part of the resistive divider. Instead of an implementation of the feedback circuit as a resistive voltage divider it may also be possible to use a capacitive voltage divider, a capacitive bridge circuit or a resistive bridge circuit.

The control terminal G of the PMOS transistor 21 is connected with a common node 19 and thus with the output sides as well of the feedback circuit 20 and the level shifter 18. The drain terminal D of the PMOS transistor 21 is connected to the third supply terminal 13 and the source terminal S is connected to the tap 17 and thus to the output terminal 12. Therefore, the conduction path of the PMOS transistor 21, i.e. the load path between the source and drain terminals S, D, is arranged between the third supply terminal 13 and the output terminal 12.

According to one embodiment of the present invention, the output side of the level shifter 18 (or the respective capacitor 23) is directly connected via the common node 19 to the control terminal G of the PMOS transistor 21.

FIG. 3 shows a further embodiment of a circuit arrangement.

In the embodiment according to FIG. 3, two additional taps 31, 32 are arranged at both sides of the electrodes of the capacitor 23. Each one of the taps 31, 32 is connected with an external terminal 33, 34. The external terminals 33, 34 are provided to allow connection of at least one external capacitor 35 in parallel to the internal (integrated) capacitor 23 to increase the capacitance of the level shifter 18.

The external capacitor 35 supports the internal capacitor 23 to provide the necessary charge for the level shifted input signal IN1.

The capacitance of the capacitor 23 may be higher or much higher than the corresponding gate capacitance of the PMOS transistor 21.

The external capacitor 35 typically comprises a higher capacitance than the internal (integrated) capacitor 23.

In a further embodiment the capacitance of the external capacitor 35 is variable adjustable.

Figure 4:
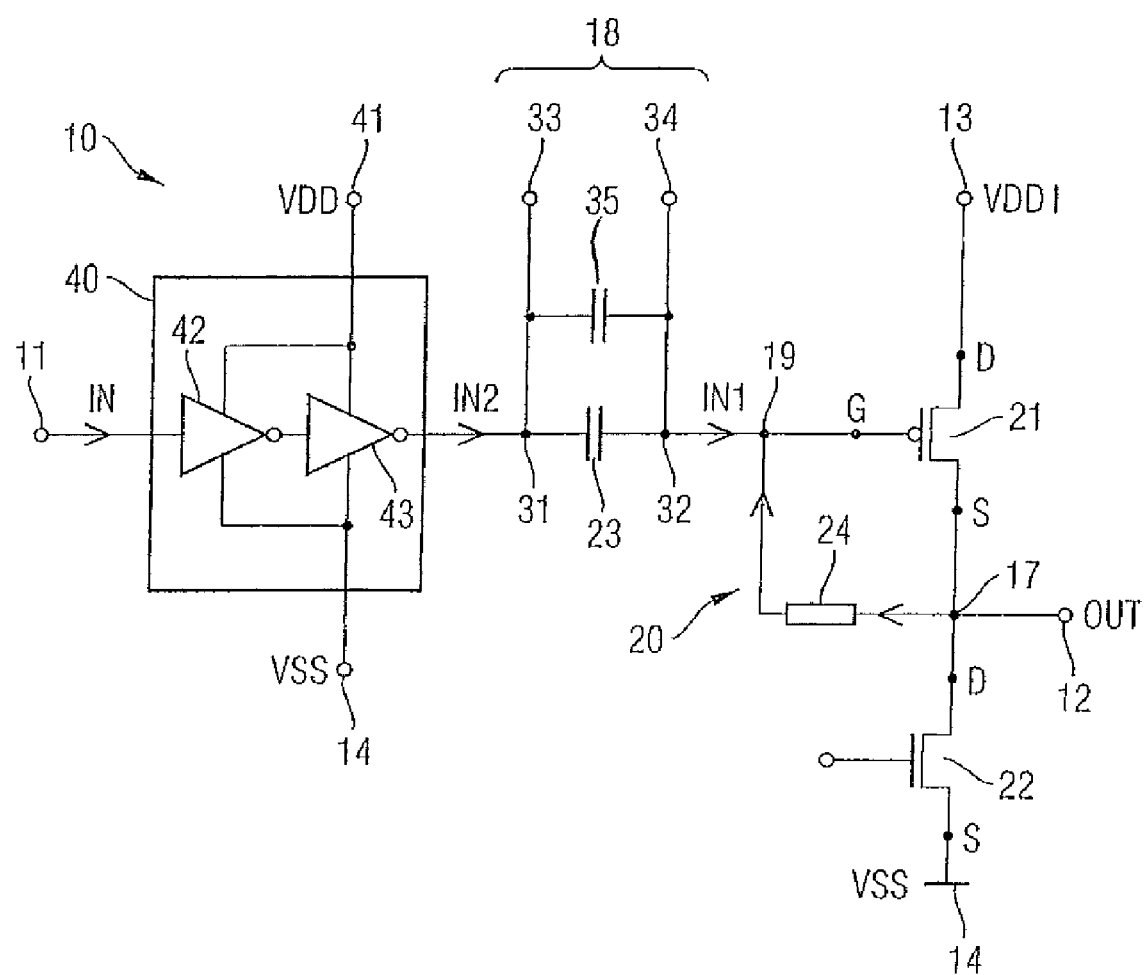
FIG. 4 shows a circuit arrangement according to an embodiment of the present invention.

FIG. 4 shows a further embodiment of a circuit arrangement.

The exemplary embodiment shown in FIG. 4 additionally comprises a driver 40. The driver 40 is arranged between the input terminal 11 and the first level shifter 18. The driver 40 is further connected to a third supply terminal 41 having the first supply potential VDD and the second supply terminal 14 having the second supply potential VSS.

In the exemplary embodiment in FIG. 4, the driver 40 comprises two inverters 42, 43 which are arranged in series connection to each other and to the input terminal 11 and the downstream arranged first level shifter 18. It is noted, that these inverters 42, 43 comprise low voltage transistors, especially low voltage MOS transistors which are supplied by a low first supply voltage V1=VDD−VSS. Since the driver 40 or the corresponding inverters 42, 43 are supplied by a low voltage V1 this allows the driver 40 to have a low power consumption.

The driver 40 forms a digital buffer for driving and charging the capacitor 23 connected downstream to the driver 40. The driver 40 serves to provide a necessary driving strength for the input signal IN. The driver 40 amplifies the input signal IN1 and generates an amplified input signal IN2. This amplified input signal IN2 is provided to the downstream arranged level shifter 18 which transfers the voltage levels of this amplified input signal IN2 to a level shifted higher voltage level.

In FIG. 4 two inverters 42, 43 are provided, which are arranged scaled to each other. However, according to one embodiment, the driver 40 may comprise only one inverter or more than two inverters. More than two low voltage inverters arranged scaled to each other may for example be provided when a high driving strength is required.

In one embodiment the inverters 42, 43 comprise a minimal delay, i.e. the signal delay between the input signal IN and the amplified input signal IN2 is minimal.

If in a further embodiment the driver 40 comprises two or more inverters 42, 43 then the last one of these inverters 42, 43, in the embodiment in FIG. 4 the inverter with reference symbol 43, is able to charge the capacitor 23 and the gate-capacitance of the PMOS-transistor 21 fast enough, i.e. with a predefined minimal signal delay.

Figure 5:
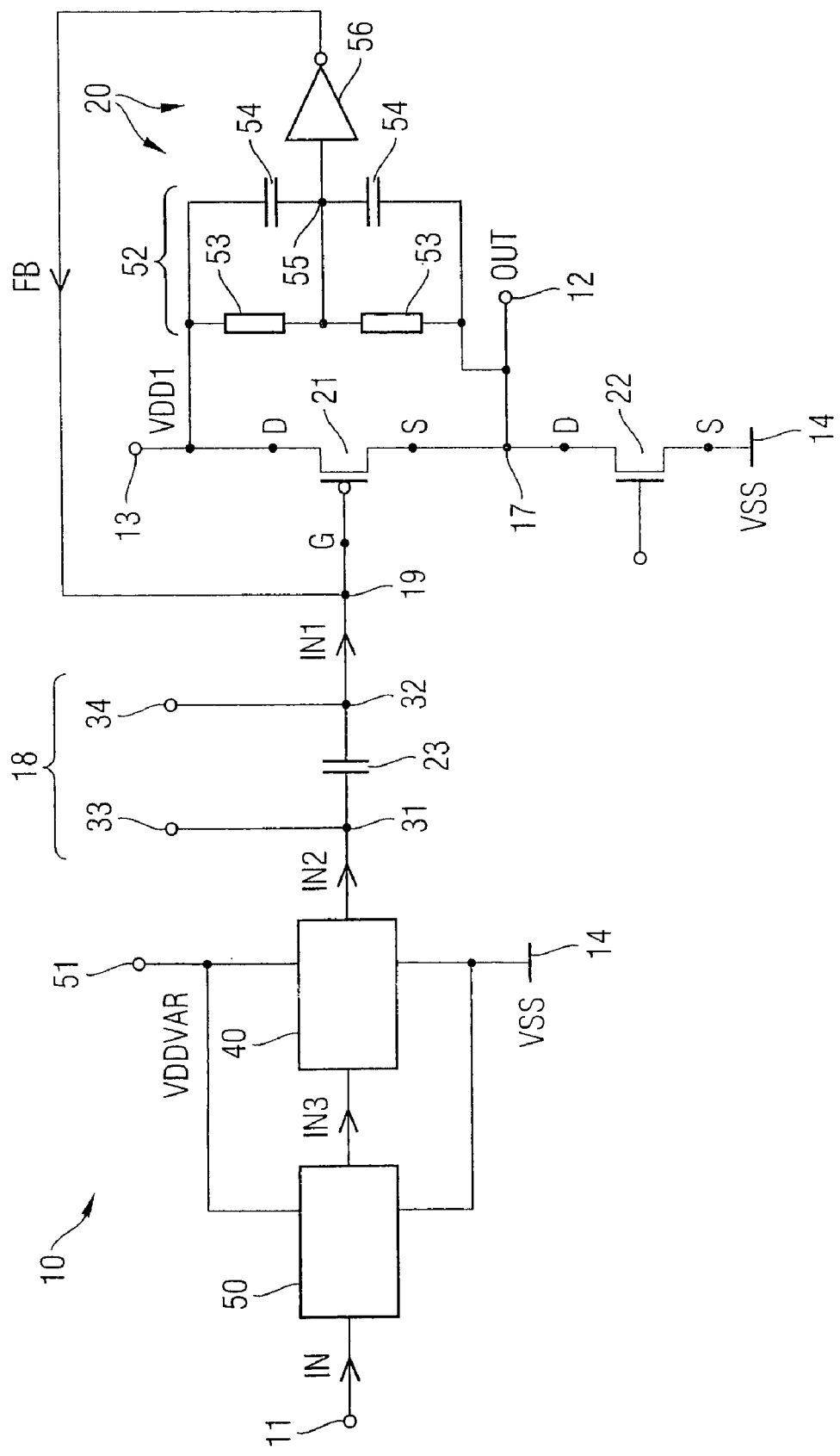
FIG. 5 shows a circuit arrangement according to an embodiment of the present invention.

FIG. 5 shows a further embodiment of a circuit arrangement.

FIG. 5 shows a further embodiment of the feedback circuit 20. The feedback circuit 20 comprises a voltage divider 52. This voltage divider 52 is arranged between the first supply terminal 13 and the tap 17 (or the output terminal 12, respectively). The voltage divider 52 comprises a resistive voltage divider 53 and a capacitive voltage divider 54. The resistive voltage divider 53 and the capacitive voltage divider 54 are arranged in parallel to each other, whereas the taps of the resistive and capacitive voltage dividers 53, 54 are connected to each other and thus form a common tap 55 of the voltage divider 52. This tap 55 is further connected to an input terminal of a downstream arranged inverter 56. The inverter 56 is used to provide a feedback signal FB with the desired polarity which is then coupled in the common node 19.

The circuit arrangement 10 in FIG. 5 additionally comprises a second level shifter 50. The second level shifter 50 is arranged between the input terminal 11 and the driver 40.

The second level shifter 50 and the driver 40 are supplied by a low second supply voltage V2=VDDVAR−VSS which is higher than the first supply voltage V1=VDD−VSS. Therefore, another supply terminal 51 having a variable supply potential VDDVAR is provided for supplying the second level shifter 50 and the driver 40 with a variable second supply voltage V2=VDDVAR−VSS.

This variable supply voltage V2 is higher than the first supply voltage V1.

The second level shifter 50 provides a level shifted input signal IN3. Since the second level shifter 50 is supplied by the supply potentials VDDVAR, VSS also the level shifted input signal IN3 shows corresponding voltage levels. Just to give an example, if VDD=1.5 Volt, VDDVAR=2 Volt and VSS=0 Volt, then the second level shifter 50 transfers the input signal IN having high and low levels between 1.5 Volt and 0 Volt into the level shifted input signal IN3 having high and low levels between 2 Volt and 0 Volt. This level shifted input signal IN3 is provided to the driver 40.

The provision of a variable supply potential VDDVAR which is higher than the first supply potential VDD is provided to compensate for a voltage drop at the gate capacitance of the PMOS transistor 21. The amplitude of the variable supply voltage V2=VDDVAR−VSS for supplying as well the second level shifter 50 and the driver 40 exceeds the amplitude of the first supply voltage V1=VDD−VSS of the input signal IN by a correction factor K as follows:

$$VDD-VSS=K*(VDDVAR-VSS)$$

This correction factor K serves to compensate the unintentional capacitive voltage divider which is given by the gate capacitance of the PMOS transistor 21. By using a second level shifter 50 which is supplied by a corresponding higher supply voltage V2 it is possible to realize a first level shifter 18 without additional external capacitors, such as in the embodiment in FIGS. 3 and 4. This implementation of a level shifting circuit according to an embodiment of the present invention allows a low power consumption.

The second level shifter 50 is for example a commonly known level shifter. This known level shifter may be for example realized by MOSFET transistors having cross-coupled gate terminals. Hereinafter, it is avoided to describe the detailed circuit assembly and function of such a level shifter 50 in more details. However, the second level shifter 50 may also be a dynamic level shifter using one or more capacitors.

Figure 6:
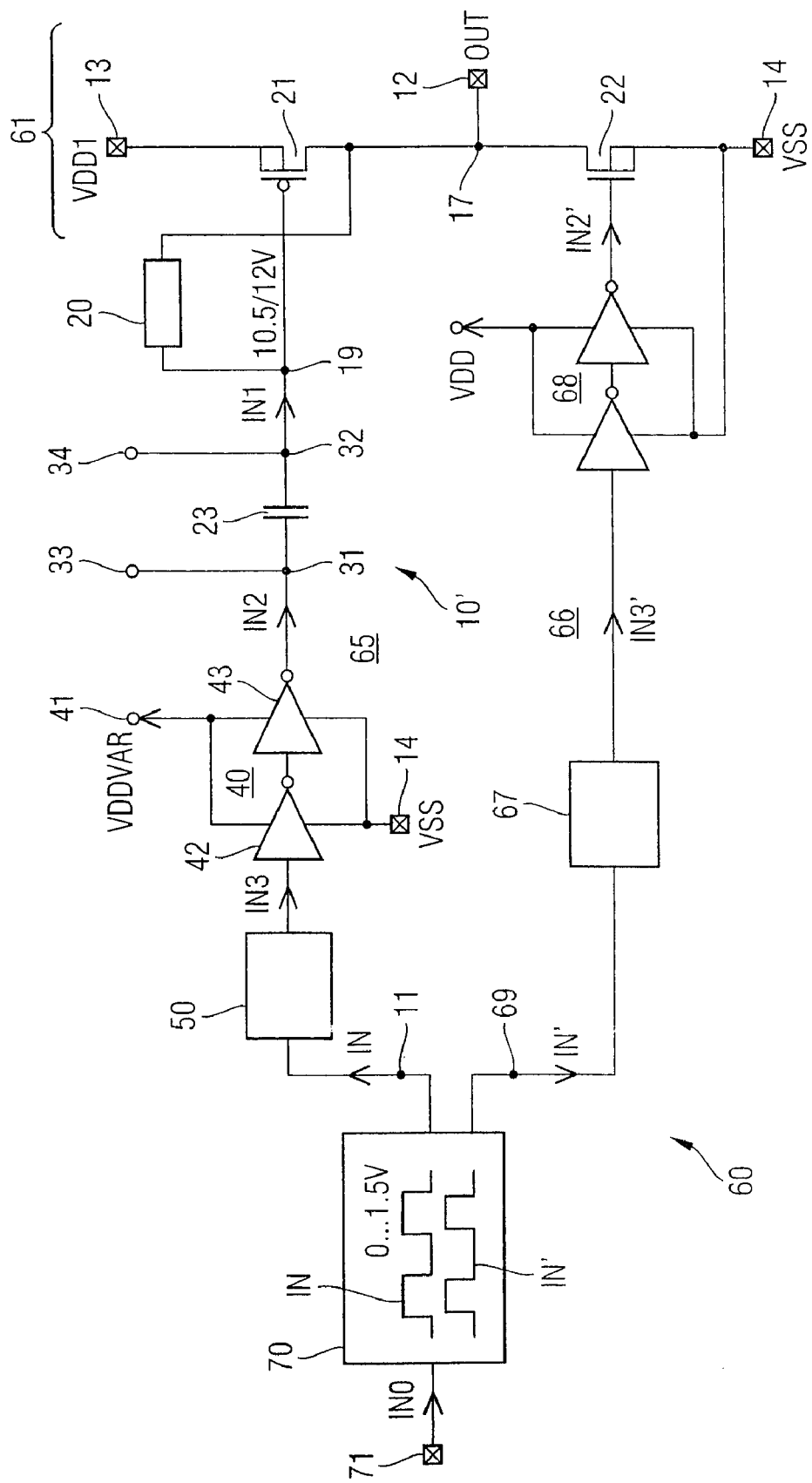
FIG. 6 shows a circuit arrangement according to an embodiment of the present invention.

FIG. 6 shows a circuit arrangement according to a further embodiment of the present invention.

In FIG. 6, the circuit arrangement 10 forms an output circuit 60 which comprises an output stage 61. The output stage 61 comprises the PMOS transistor 21 and the NMOS transistor 22 which are arranged in series connection to each other with regard to their conduction paths (load paths). This series connection is arranged between the first supply terminal 13 having the supply potential VDD1 and the second supply terminal 14 having the supply potential VSS. These supply potentials VDD1, VSS define the third supply voltage V3=VDD1–VSS.

The output circuit 60 further comprises a first branch 65 and a second branch 66. Each one of these branches 65, 66 is assigned to one of the transistor 21, 22. Especially, each one of these branches 65, 66 serves for controlling the gate terminals G of the corresponding MOSFETS 21, 22. In the present embodiment, the first branch 65 is a p-type branch which is assigned to the PMOS transistor 21 and the second branch 66 is a n-type branch which is assigned to the NMOS transistor 22.

The p-type branch 65 comprises a circuit arrangement 10' according to the exemplary embodiment in FIG. 5 whereas in FIG. 5 the PMOS transistor is part of the circuit arrangement 10 and in FIG. 6 the PMOS transistor 21 is part of the output stage 61. The circuit arrangement 10' in FIG. 6 comprises the second level shifter 50, the driver 40 and the capacitor 23 of the first level shifter 18 which are connected in series connection to each other. Further, the circuit arrangement 10' comprises the feedback circuit 20. This circuit arrangement 10' is arranged between the input terminal 11 and the gate terminal G of the PMOS transistor 21.

The n-type branch 66 of the output circuit 60 comprises a dummy circuit 67 and a further driver 68 which are arranged in series between a further input terminal 69 and the gate terminal G of the NMOS transistor 22. The further input terminal 69 receives the further input signal IN' which has a shape similar to the input signal IN. This further input signal IN' is fed into the dummy circuit 67. The dummy circuit 67 serves to simulate a time delay the input signal IN would have when running through the second level shifter 50 in the p-type branch 65. This allows exact timing of the two input signals IN, IN' when running through the different branches 65, 66. Thus, the dummy circuit 67 generates a time delayed input signal IN3' whereas the timing of the input signal IN3' in the n-type branch 66 is at least similar to the corresponding timing of the amplified input signal IN3 in the p-type branch 65.

The input signal IN3' is received by the driver 68 which is arranged downstream the dummy circuit 67. The driver 68 generates an input signal IN1'. The driver 68 in the n-branch is supplied by the first supply voltage V1=VDD–VSS.

Furthermore, the output circuit 60 in FIG. 6 comprises a signal generator 70. The signal generator 70 is on its input side connected to a common input terminal 71 for receiving a common digital input signal INO. The signal generator 70 generates the two digital input signals IN, IN' out of the common digital input signal INO whereas these two input signals IN, IN' are non-overlapping to each other. The provision of non-overlapping output signals IN, IN' allows is non-overlapping controlling of the transistors 21, 22. This allows an operation of the output circuit 60 and especially of its output stage 61 without any cross current between the two transistors 21, 22.

In the present exemplary embodiment, the output circuit 60 may be a power line driver for providing an output signal OUT having a high voltage, for example a voltage between 0 Volt and 12 Volt. According to one embodiment, the output circuit 60 may be implemented in a line driver for example for broadband telecommunication applications such as VDSL or ADSL. However, output circuit 60 may be use also for other applications, for example automotive applications.

As can be seen in FIG. 6a the circuit arrangement 10' in the p-branch is used to transfer the voltage levels of the input signal IN to respective higher voltage levels to form the control signal IN1'. However, the circuit arrangement 10' provides the level shifted control signal IN1 having ideally the same signal swing than the level shifted input signal IN. That means the control signal IN1 is only transferred to a higher level and thus is referenced to another reference voltage than the input signal IN.

In the n-branch bb the input signal IN' is according to one embodiment only propagated to the gate terminal G of the NMOS transistor 22.

Figure 7:
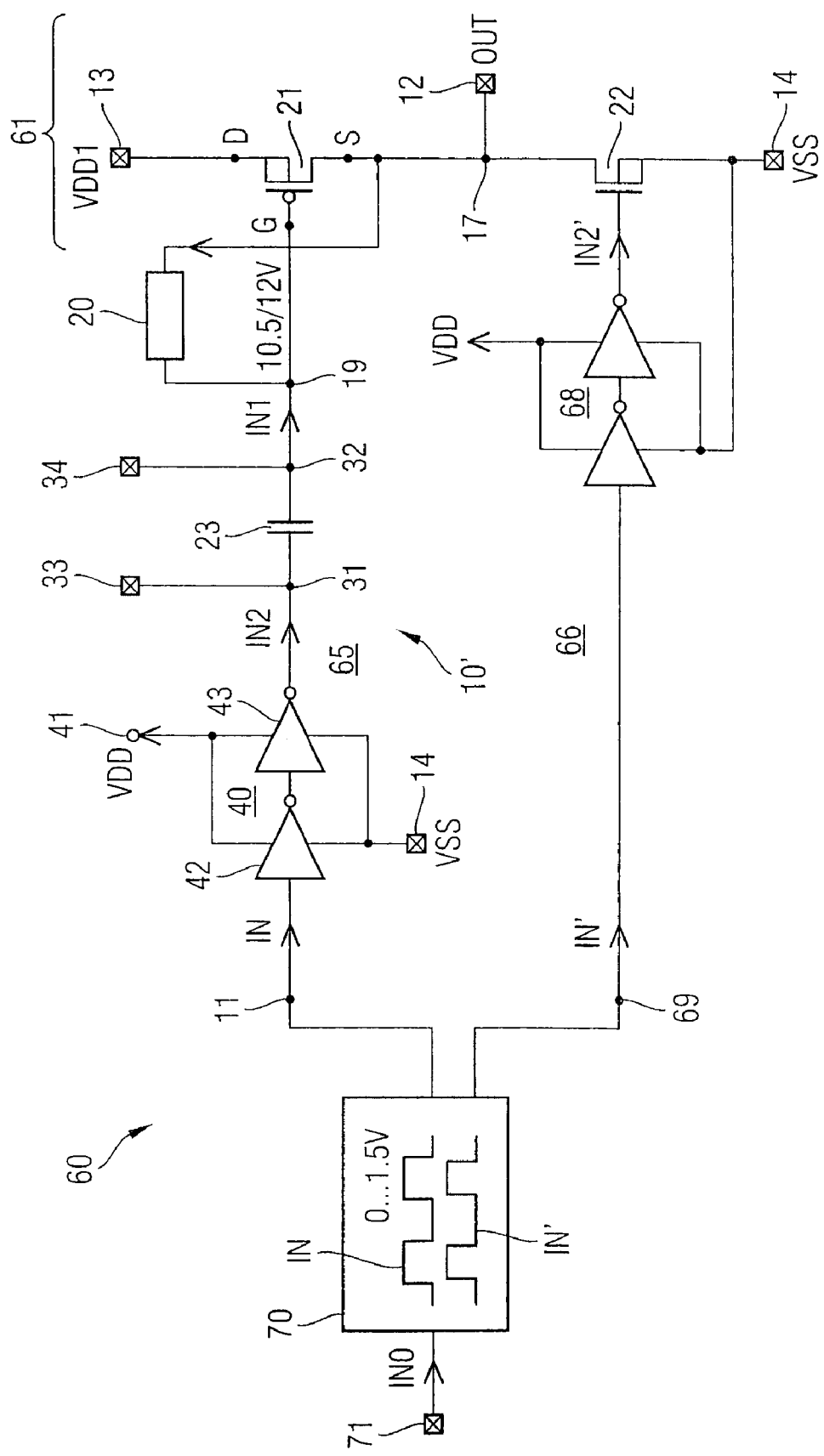
FIG. 7 shows a circuit arrangement according to an embodiment of the present invention.

FIG. 7 shows a circuit arrangement according a further embodiment of the present invention.

Unlike the exemplary embodiment in FIG. 6, the output circuit 60 in FIG. 7 possesses a circuit arrangement 10' which is similar to the one shown in FIG. 4. That means the circuit arrangement 10' comprises a driver 40, the first level shifter 18 having a capacitor 23 and an additional external capacitor 35 and a feedback circuit 20.

Within the circuit arrangement 10' in FIG. 7, an additional level shifter 50, such as used in the exemplary embodiments in FIGS. 5 and 6, may not be provided in the p-branch 65. In addition, also a dummy circuit 67 may not be provided in the n-branch 66.

Figure 8B:
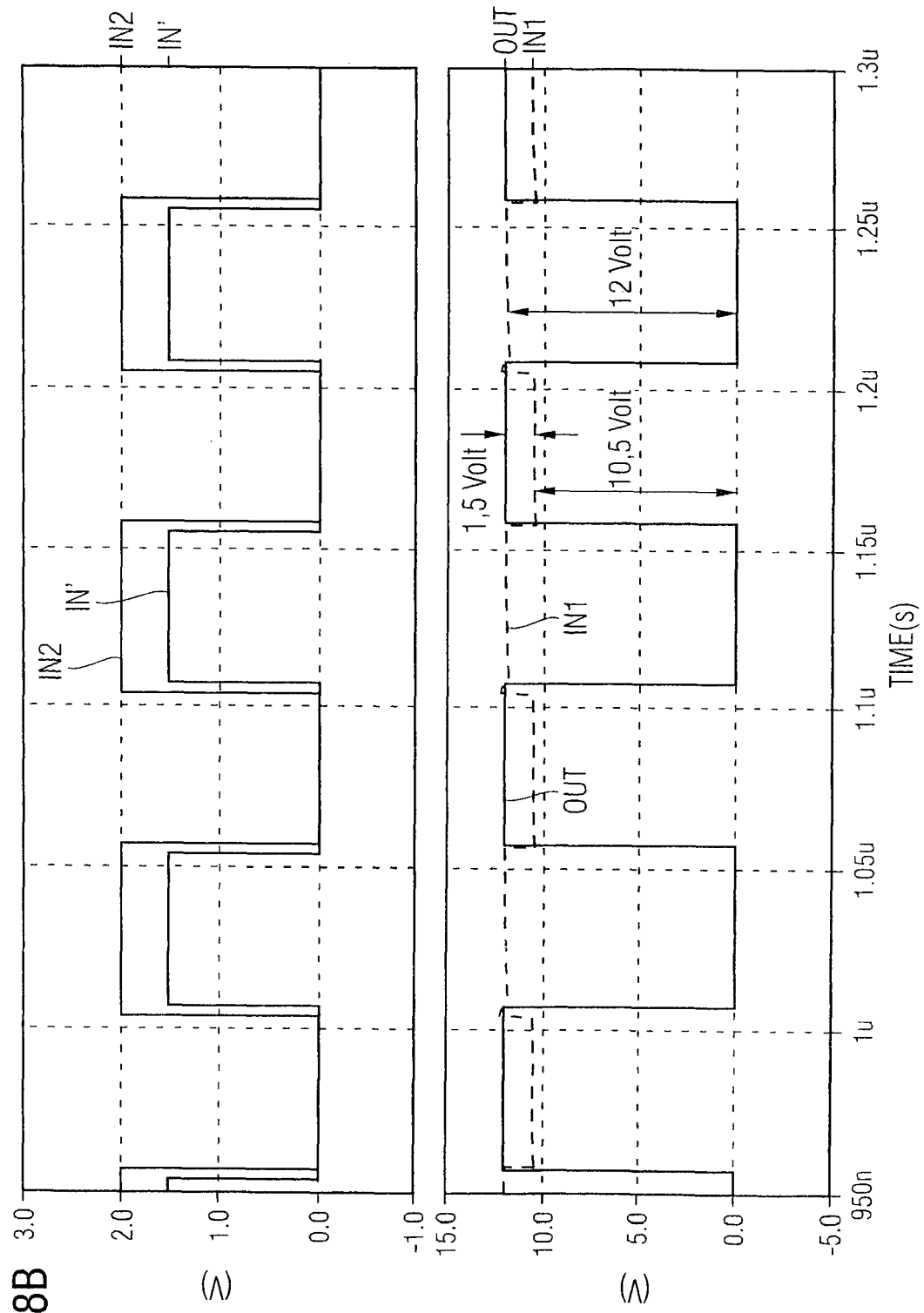

FIGS. 8a and 8b show two timing diagrams for illustrating the principal level-shifting operation of the circuit arrangements as shown in FIGS. 6 and 7. It is noted that the numerical data given in these figures are just exemplary for the better understanding of the embodiments shown with regard to the FIGS. 6 and 7.

Although exemplary embodiments of the present invention have been described above, it is not limited thereto but rather can be modified in a wide variety.

It will be understood by those skilled in the art that various changes and modifications may be made, and equivalences maybe substituted for elements thereof without departing from the true scope of the invention. In addition, many modifications may be made to adapt a particular situation or material of the teaching of the invention without departing from the central scope thereof.

Embodiments of the invention were described above mainly with regard to a high voltage level shifting circuit. However, the invention is not limited thereto, and further embodiments may include other level shifter such as a low voltage level shifter.

Furthermore, the level shifter may be provided for a line driver for example a ADSL or VDSL line driver circuits. The circuit arrangement and the output circuit according to the present invention may also be used in any other applications which are may be broadband telecommunication applications or other telecommunication applications, for example automotive applications, electronic data processing, industrial control application, computer applications, which also need a level shifter especially for the transformation of a low voltage to a thereto relatively high voltage.

Furthermore, while embodiments of the present invention have been discussed in connection with a CMOS technology, it is to be understood that the inventive principles also apply to other technologies, such as JFET or bipolar technologies. Moreover, the transistors of the output stage and also any other transistors of the describe embodiments may not necessarily be a MOSFET-type transistors, but can also be a JFET, a bipolartransistor, an IGBT, etc. The given numerical data are given only to a better understanding, however, they are not intended to limit the invention thereon.

What we claim is:

1. Circuit arrangement, comprising:
   a first level shifter coupled to receive an input signal having a first voltage level from an input terminal, the first level shifter configured to provide a level-shifted signal having a second voltage level higher than the first voltage level,
   an output stage comprising a first transistor, the first transistor comprising a control terminal operably coupled to an output of the first level shifter and configured to provide at an output terminal of the output stage an output signal based on the level-shifted signal, and a first supply terminal configured to provide a first supply voltage, wherein the first transistor is directly connected to the first supply terminal,
   wherein the first supply terminal provides a first supply voltage higher than the first voltage level, and
   wherein a conduction path of the first transistor is arranged between the first supply terminal and the output terminal,
   a feedback circuit configured to feed back the output signal to the output of the first level shifter.

2. The circuit arrangement as claimed in claim 1, wherein the control terminal of the first transistor is connected to a node, wherein the output of the first level shifter and the feedback circuit are further directly connected to the node.

3. The circuit arrangement as claimed in claim 1, wherein the first level shifter comprises at least one device having a capacitance, wherein the at least one device comprises a first electrode coupled to the input terminal and a second electrode coupled to the output of the first level shifter and the feedback circuit.

4. The circuit arrangement as claimed in claim 3, wherein the device comprises at least one capacitor.

5. The circuit arrangement as claimed in claim 4, wherein the capacitance of the at least one capacitor is higher than a gate-capacitance of the first transistor.

6. The circuit arrangement as claimed in claim 4, wherein the capacitance of the at least one capacitor is within a range of 0.5 to 1.5 of the gate-capacitance of the first transistor.

7. The circuit arrangement as claimed in claim 1, wherein the feedback circuit comprises a voltage divider.

8. The circuit arrangement as claimed in claim 7, wherein the voltage divider comprises a capacitive or a resistive bridge circuit.

9. The circuit arrangement as claimed in claim 1, further comprising a driver operably coupled between the input terminal and the first level shifter.

10. The circuit arrangement as claimed in claim 9, wherein the driver is configured to provide a first signal to the level shifter having a third voltage level, wherein the third voltage level is in the range between the first and the second voltage level.

11. The circuit arrangement as claimed in claim 10, wherein the third voltage level is variable dependent on a supply voltage applied to the driver.

12. The circuit arrangement as claimed in claim 9, wherein the driver comprises at least two inverters which are scaled to each other.

13. The circuit arrangement as claimed in claim 11, further comprising a second level shifter operably coupled between the input terminal and the driver and configured to provide a second level-shifted signal having the variable third voltage level.

14. The circuit arrangement as claimed in claim 9, wherein the driver is configured to provide a second signal to the first level shifter having the first voltage level.

15. The circuit arrangement as claimed in claim 4, further comprising a first external capacitor terminal connected to a first electrode of the capacitor and a second external capacitor terminal connected to a second electrode of the capacitor configured to be connected to at least one external capacitor parallel to the at least one device.

16. The circuit arrangement as claimed in claim 4, further comprising a second supply terminal having a second supply voltage wherein said second supply voltage is either a ground potential or a reference potential and a third supply terminal having a third supply voltage, wherein the third supply voltage is equal to the first voltage level or in the range between the first voltage level and the second voltage level.

17. The circuit arrangement as claimed in claim 16, wherein the third supply voltage is at least by a factor $((C2+C1)/C1)$ higher than the first voltage level, wherein $C1$ is the capacitance of the capacitor and $C2$ is the gate-capacitance of the first transistor and a parasitic capacitance.

18. The circuit arrangement as claimed in claim 13, wherein the second level shifter is supplied by the second supply voltage and the third supply voltage.

19. The circuit arrangement as claimed in claim 14, wherein the driver is supplied by the second supply voltage and the third supply voltage.

20. The circuit arrangement as claimed in claim 1, wherein the first transistor is a field controlled transistor.

21. The circuit arrangement as claimed in claim 1, wherein the first transistor is a p-channel MOSFET comprising:
    a source terminal connected to the output terminal,
    a drain terminal connected to a first supply terminal, and
    a gate terminal which is operably connected to the output of the first level shifter.

22. The circuit arrangement as claimed in claim 1, wherein the output stage comprises a second transistor having a conductivity type opposite to the conductivity type of the first transistor, wherein the conduction paths of the first transistor and the second transistor are arranged in series connection to each other and between a first supply terminal and a second supply terminal, and wherein a tap between the first transistor and the second transistor defines an output terminal of the circuit arrangement.

23. The circuit arrangement as claimed in claim 22, further comprising a first branch having the first level shifter and a first input terminal configured to receive a first input signal having the first voltage level, and further comprising a second branch having the second output transistor and a second input terminal for a second input signal having the first voltage level.

24. The circuit arrangement as claimed in claim 22, wherein a further circuit is provided wherein the input terminal of the circuit arrangement forms the input of the further circuit and wherein an output of the further circuit is coupled to the first input terminal and the second input terminal to provide two non-overlapping digital input signals of a similar shape based on the input signal to the first input terminal and the second input terminal, respectively.

25. The circuit arrangement as claimed in claim 23, further comprising a dummy circuit within the second branch configured to delay the second input signal such that the first input signal and the second input signal have a same delay when running through their respective branches.

26. The circuit arrangement as claimed in claim 23, wherein the second branch comprises a second driver between the second input terminal and the second transistor, wherein the second driver corresponds to the first driver.

27. A circuit arrangement, comprising:
an input terminal to receive a first signal having a first voltage level,
a driver coupled to the input terminal to receive the first signal and configured to provide a second signal based on the first signal,
wherein the driver is provided between the input terminal and a first level shifter, and wherein a second level shifter is provided between the input terminal and the driver to provide to the driver a second level-shifted signal having the variable third voltage level,
a capacitor comprising a first electrode directly connected downstream to the driver to receive the second signal and a second electrode to provide a third signal having a second level higher than the first level, and
an output stage comprising a transistor, the transistor comprising a control terminal coupled to the second electrode of the capacitor to receive the third signal and to provide an output signal based on the received third signal.

28. The circuit arrangement as claimed in claim 27, further comprising a circuit coupled to the second electrode to provide at the second electrode a voltage higher than the first voltage level.

29. The circuit arrangement as claimed in claim 28, wherein the circuit is a feedback circuit to feed back the output signal to the second electrode of the capacitor.

30. The circuit arrangement as claimed in claim 29, wherein the feedback circuit comprises a voltage divider.

31. The circuit arrangement as claimed in claim 27, wherein the capacitance of the capacitor is higher than a gate-capacitance of the first transistor.

32. The circuit arrangement as claimed in claim 27, wherein the driver provides a first signal having a third voltage level to the level shifter, wherein the third voltage level is in a range between the first and the second voltage level.

33. The circuit arrangement as claimed in claim 32, wherein the third voltage level is variable dependent on a supply voltage applied to the driver.

34. The circuit arrangement as claimed in claim 27, wherein a first external capacitor terminal connected to the first electrode of the capacitor and a second external capacitor terminal connected to the second electrode of the capacitor are provided to connect at least one external capacitor in parallel to the at least one capacitor.

35. The circuit arrangement as claimed in claim 27, wherein the output stage comprises a second transistor having a conductivity type opposite to the conductivity type of the first transistor, wherein the conduction paths of the first transistor and the second transistor are arranged in series connection to each other and between the first supply terminal and the second supply terminal, wherein a tap between the first and the second transistors defines an output terminal of the circuit arrangement.

36. A method for operating a circuit arrangement, comprising the steps of:
providing a digital input signal having a first voltage level to an input terminal of the circuit arrangement;
carrying out a level shifting of the digital input signal having the first voltage level to provide a level-shifted signal having a second voltage level higher than the first voltage level;
providing the level-shifted signal to a control terminal of a first transistor for switching the first transistor and for providing at an output terminal of the first transistor an output signal based on the level-shifted signal, wherein the output signal is derived from a first supply voltage higher than the first voltage level; and
feeding back the output signal to the control terminal of the first transistor.

37. The method as claimed in claim 36, wherein the fed back output signal together with the level shifted signal are directly provided to the control terminal of the first transistor.

38. The method as claimed in claim 36, wherein prior to the step of level shifting the input signal this input signal is amplified to provide an amplified input signal.

39. The method as claimed in claim 38, wherein prior to the step of amplifying the input signal this input signal is level shifted to provide a level shifted input signal.

40. The method as claimed in claim 36, wherein the step of level shifting is performed by a capacitor.

41. The method as claimed in claim 36, wherein the capacitor is an internal capacitor and wherein for the step of level shifting an external capacitor is connected in parallel to the internal capacitor.

42. The method as claimed in claim 36, wherein a second transistor is provided having a conductivity type opposite to the conductivity type of the first transistor, wherein the conduction paths of the first transistor and the second transistor are arranged in series connection to each other and between the first supply terminal and the second supply terminal, wherein two non overlapping digital input signals of a similar shape based on the input signal are generated and each one of these non-overlapping signals is assigned to a corresponding control terminal of the first and second transistors.

* * * * *